US012749639B2

(12) United States Patent
Liu

(10) Patent No.: US 12,749,639 B2
(45) Date of Patent: Sep. 29, 2026

(54) RELAY CIRCUIT BOARD

(71) Applicants: HongQiSheng Precision Electronics (QinHuangdao) Co., Ltd., Hebei Province (CN); Avary Holding (Shenzhen) Co., Ltd., Shenzhen (CN); Garuda Technology Co., Ltd., New Taipei City (TW)

(72) Inventor: Feng-Mei Liu, Hebei Province (CN)

(73) Assignees: HongQiSheng Precision Electronics (QingHuangdao) Co., Ltd., Hebei Province (CN); Avary Holding (Shenzhen) Co., Ltd., Shenzen (CN); Garuda Technology Co., Ltd., New Taipei City (TW)

(*) Notice: Subject to any disclaimer, the term of this patent is extended or adjusted under 35 U.S.C. 154(b) by 305 days.

(21) Appl. No.: 18/497,298

(22) Filed: Oct. 30, 2023

(65) Prior Publication Data

US 2025/0140500 A1 May 1, 2025

(51) Int. Cl.
*H01H 47/22* (2006.01)
*H01H 49/00* (2006.01)
*H01H 50/02* (2006.01)
*H01H 50/44* (2006.01)
*H05K 3/30* (2006.01)

(52) U.S. Cl.
CPC ............ *H01H 47/22* (2013.01); *H01H 49/00* (2013.01); *H01H 50/02* (2013.01); *H01H 50/44* (2013.01); *H05K 3/30* (2013.01)

(58) Field of Classification Search
CPC ........ H01H 47/22; H01H 49/00; H01H 50/02; H01H 50/44; H05K 3/30
USPC .......................................................... 361/626
See application file for complete search history.

(56) References Cited

U.S. PATENT DOCUMENTS

| | | | | |
|---|---|---|---|---|
| 6,778,058 B1 * | 8/2004 | Branchevsky | H05K 1/162 | 336/200 |
| 6,914,508 B2 * | 7/2005 | Ferencz | H01F 27/2804 | 336/200 |
| 6,996,892 B1 * | 2/2006 | Dening | H05K 1/165 | 336/200 |
| 7,352,270 B1 * | 4/2008 | Copeland | H01F 17/0033 | 336/200 |

(Continued)

FOREIGN PATENT DOCUMENTS

| | | |
|---|---|---|
| CN | 102064048 A | 5/2011 |
| TW | 202117772 A | 5/2021 |

*Primary Examiner* — Anatoly Vortman
(74) *Attorney, Agent, or Firm* — MUNCY, GEISSLER, OLDS & LOWE, P.C.

(57) ABSTRACT

A relay circuit board includes a first external circuit structure, a second external circuit structure, an internal circuit structure, a magnetic induction element, and a switch assembly. The internal circuit structure is disposed between the first external circuit structure and the second external circuit structure. The switch assembly is disposed in a first cavity of the first external circuit structure. The magnetic induction element is disposed in a second cavity of the internal circuit structure. The internal circuit structure includes a plurality of multiple coil circuits. The coil circuits surround the magnetic induction element and are embedded in an inner wall of the second cavity. When the coil circuits are energized, the magnetic induction element generates a magnetic field.

7 Claims, 7 Drawing Sheets

(56) References Cited

U.S. PATENT DOCUMENTS

| | | | | |
|---|---|---|---|---|
| 7,639,473 | B2 * | 12/2009 | Hsu | H05K 1/185 361/312 |
| 7,973,635 | B2 * | 7/2011 | Baarman | H01F 27/2804 336/200 |
| 8,094,458 | B2 * | 1/2012 | Furnival | H05K 1/165 336/200 |
| 8,174,343 | B2 * | 5/2012 | Shen | H01H 1/0036 335/85 |
| 8,446,236 | B2 | 5/2013 | McGuire | |
| 9,001,524 | B1 * | 4/2015 | Akre | H01F 27/027 257/784 |
| 9,076,615 | B2 * | 7/2015 | Baks | H01H 50/005 |
| 9,947,456 | B2 * | 4/2018 | Biglarbegian | H05K 3/0005 |
| 10,811,181 | B2 * | 10/2020 | Parish | H01F 27/266 |
| 2002/0109568 | A1 | 8/2002 | Wohlfarth | |
| 2009/0051475 | A1 * | 2/2009 | Hsueh | H01F 17/04 336/83 |
| 2013/0236337 | A1 * | 9/2013 | Gummin | F04B 43/043 310/15 |
| 2015/0028599 | A1 * | 1/2015 | Suzuki | F02N 11/087 290/38 C |
| 2023/0154665 | A1 * | 5/2023 | Huang | H05K 1/188 336/221 |

* cited by examiner

RELAY CIRCUIT BOARD

BACKGROUND

Field of Invention

The present invention relates to a relay circuit board and a manufacturing method thereof.

Description of Related Art

The existing relay is usually externally connected to a circuit board, for example, mounted on the circuit board to achieve the function of the relay. However, a thickness of the relay is much larger than that of a general circuit board, which makes an overall size (such as a volume) of the circuit board mounted on the relay large, thereby making it difficult to meet the current trend of miniaturization of electronic products.

SUMMARY

The embodiments of the present invention provide a relay circuit board and a manufacturing method thereof, in which a magnetic induction element and a switch assembly embedded in a circuit board are used to form the embedded relay circuit board, thereby reducing an overall size of the relay circuit board.

A relay circuit board provided by at least one embodiment of the present invention includes a first external circuit structure, a second external circuit structure, an internal circuit structure, a magnetic induction element, and a switch assembly. The first external circuit structure has a first cavity. The internal circuit structure is disposed between the first external circuit structure and the second external circuit structure and has a second cavity, wherein the second cavity extends from the first external circuit structure to the second external circuit structure, and the first cavity communicates with the second cavity. The magnetic induction element is disposed in the second cavity. The switch assembly is disposed in the first cavity, wherein at least one surface of the switch assembly is exposed to an exterior of the relay circuit board, and a gap exists between the switch assembly and the magnetic induction element, wherein the internal circuit structure includes a plurality of coil circuits, the plurality of coil circuits surrounds the magnetic induction element and is embedded in an inner wall of the second cavity, wherein when the coil circuits are energized, the magnetic induction element generates a magnetic field.

In some embodiments, the switch assembly includes a moving part and a spring. The moving part includes a main portion and an extension portion connected to the main portion, wherein the magnetic induction element uses the magnetic field to attract the moving part such that the moving part is connected to the magnetic induction element. The first spring surrounds the extension portion of the moving part.

In some embodiments, the switch assembly further comprises a second spring and a conductive block, wherein the second spring is connected to the moving part and the conductive block, and the conductive block is used to electrically connect to a load.

In some embodiments, both the magnetic induction element and the moving part are unmagnetized ferromagnets or unmagnetized ferrite magnets.

In some embodiments, when the plurality of coil circuits is de-energized, the first spring biases the moving part away from the magnetic induction element.

In some embodiments, the switch assembly further includes a housing, wherein the gap is located between the housing and the magnetic induction element, the housing includes an opening, and the opening is configured to allow the extension portion of the moving part to shuttle between an interior of the housing and the gap.

In some embodiments, the internal circuit structure comprises a plurality of insulating layers and a plurality of circuit layers, and the insulating layers and the circuit layers are arranged in a staggered manner.

A manufacturing method of a relay circuit board provided by at least one embodiment of the present invention includes the following steps: providing an internal circuit structure; forming a first threaded hole in the internal circuit structure by using a first thread drill, wherein a first inner wall of the first threaded hole has a threaded pattern; depositing a metal layer in a first inner wall of the first threaded hole; after depositing the metal layer, forming a second threaded hole in the first threaded hole and the metal layer by using a second thread drill, wherein a second inner wall of the second threaded hole has spiral coil circuits; disposing a magnetic induction element in the second threaded hole; forming a first external circuit structure on a first surface of the internal circuit structure; forming a second external circuit structure on a second surface of the internal circuit structure, wherein the first surface is opposite to the second surface; and disposing a switch assembly in the first external circuit structure, wherein a gap exists between the switch assembly and the magnetic induction element.

In some embodiments, the manufacturing method of the relay circuit board further includes the following steps: before disposing the magnetic induction element in the second threaded hole, disposing an adhesive tape on the second surface of the internal circuit structure; and after disposing the magnetic induction element in the second threaded hole, removing the adhesive tape.

In some embodiments, the manufacturing method of the relay circuit board further includes the following steps: during disposing the magnetic induction element in the second threaded hole, filling a dielectric material between the magnetic induction element and the second inner wall.

In some embodiments, the dielectric material fills the gaps between the magnetic induction element and the second inner wall by pressing.

In some embodiments, the manufacturing method of the relay circuit board further includes the following steps: before disposing the switch assembly in the first external circuit structure, forming a recess in the first external circuit structure.

In some embodiments, the manufacturing method of the relay circuit board further includes the following steps: during disposing the switch assembly in the first external circuit structure, filling a dielectric material between the switch assembly and the recess.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
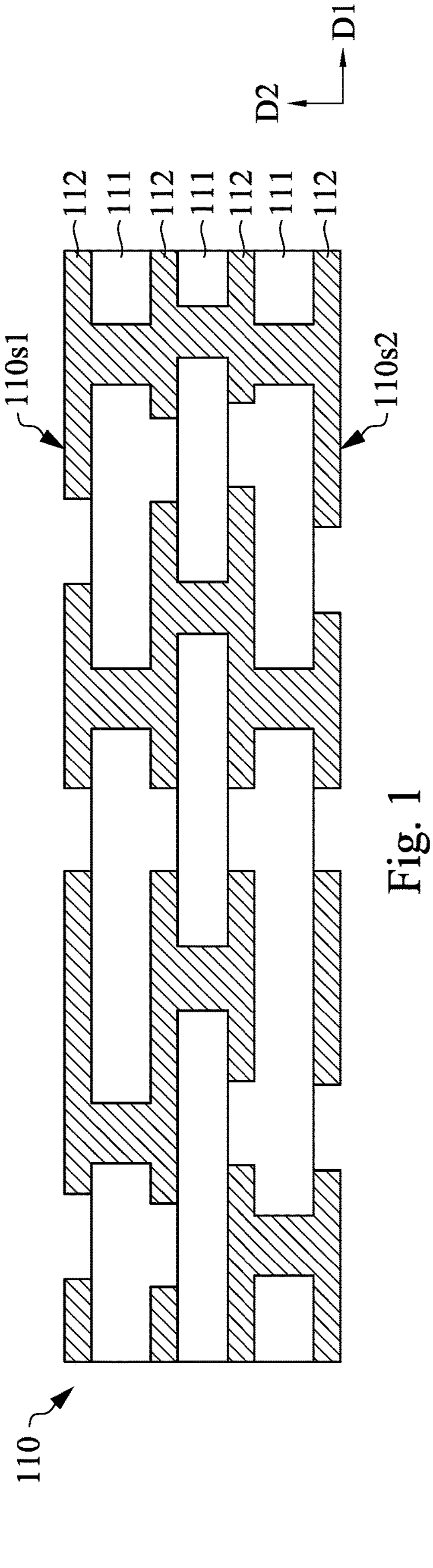
FIG. 1 to FIG. 10 are cross-sectional views of a relay circuit board in various stages of the manufacturing process in according to at least one embodiment of the present invention.

In the following text, in order to clearly present the technical features of the present disclosure, the dimensions (such as lengths, widths, thicknesses and depths) of the components (such as circuit layers, dielectric layers, and pads, etc.) in the drawings may be enlarged in a non-proportional manner, and the number of some components may be reduced. Therefore, the description and explanation of the following embodiments are not limited to the number of components in the drawings and the size and shape of the components, but should cover the deviations in sizes, shapes and both caused by actual manufacturing processes and/or tolerances. For example, a planar surface shown in the drawings may have rough and/or non-linear features, while acute angles shown in the drawings may be rounded. Therefore, the components shown in the drawings of the present disclosure are mainly for illustration, and are not intended to accurately depict the actual shapes of the components, nor are used to limit the scope of the patent application of the present disclosure.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. That is, when the device is oriented differently from the drawings (rotated 90 degrees or at other orientations), the spatially relative terms used in the present disclosure may also be interpreted accordingly.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

It should be noted that a first direction D1 and a second direction D2 are labeled in the drawings to present the configuration relationship of the components in the drawings, and the first direction D1 and the second direction D2 are substantially perpendicular to each other.

Referring to FIG. 1 to FIG. 10, FIG. 1 to FIG. 10 are cross-sectional views of a relay circuit board 100 in various stages of the manufacturing process in according to at least one embodiment of the present invention. Reference is made to FIG. 1. The internal circuit structure 110 includes a plurality of insulating layers 111 and a plurality of circuit layers 112, in which the insulating layers 111 and the circuit layers 112 are arranged in a staggered manner. Specifically, each of the insulating layers 111 and each of the circuit layers 112 extend along a direction parallel to the first direction D1 and are stacked along a second direction D2 perpendicular to the first direction D1. The internal circuit structure 110 includes a first surface 110*s*1 and a second surface 110*s*2, in which the second surface 110*s*2 is opposite to the first surface 110*s*1.

In some embodiments, a material of the insulating layer 111 can be an insulating material such as polyimide (PI), glass fiber epoxy resin (FR4), polyethylene terephthalate (PET), polyethylene naphthalate (PEN), or polyethylene (PE), but is not limited thereto.

The circuit layer 112 can be formed by using an additive process or a semi-additive process. In some embodiments, the circuit layer 112 can be formed by using regular electroplating or laser electroplating. In some embodiments, a material of the circuit layer 112 can be a conductive material such as copper, gold, or silver, but is not limited thereto. Different insulating layers 111 and different circuit layers 112 can be pressed together to form a stacked structure.

Figure 2:
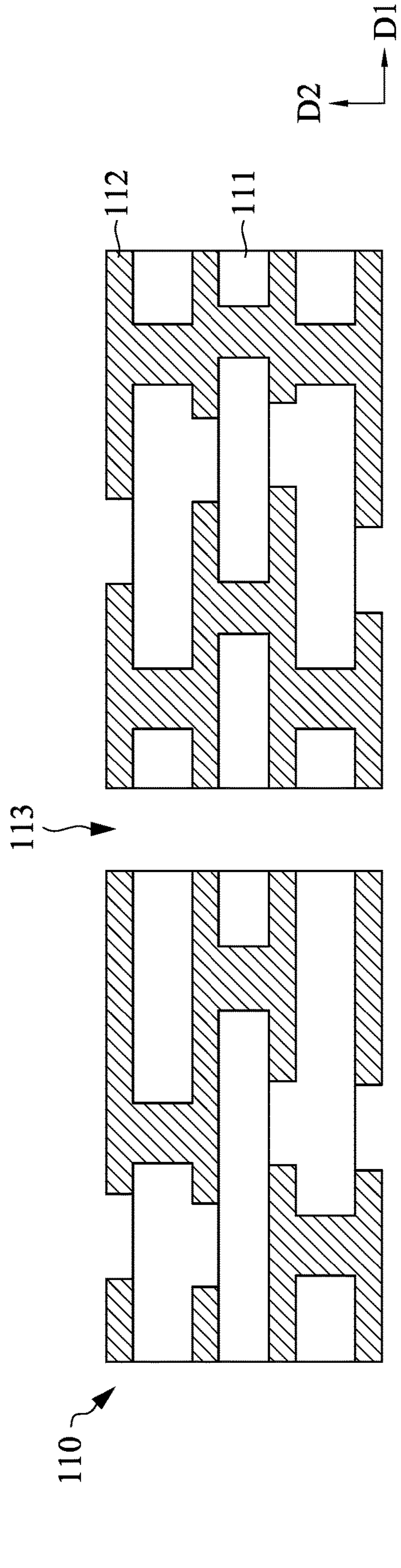

Reference is made to FIG. 2. A through-hole 113 is formed in the internal circuit structure 110 by using mechanical drilling or laser drilling, in which the through-hole 113 extends along a thickness direction (i.e., the second direction D2) of the internal circuit structure 110.

Figure 3:
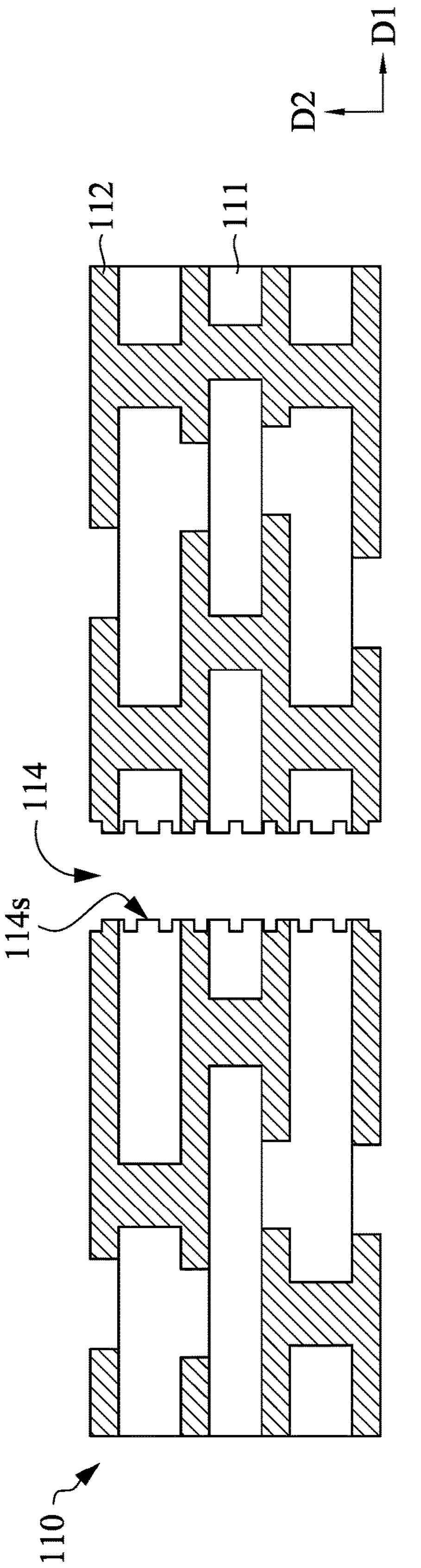

Reference is made to FIG. 3. A first threaded hole 114 is formed in the through-hole 113 by using a first thread drill (not shown), in which a first inner wall 114*s* of the first threaded hole 114 has a threaded pattern. It could be understood that the first thread drill can be a forward thread drill, so that the first inner wall 114*s* in FIG. 3 has a clockwise threaded pattern.

Figure 4:
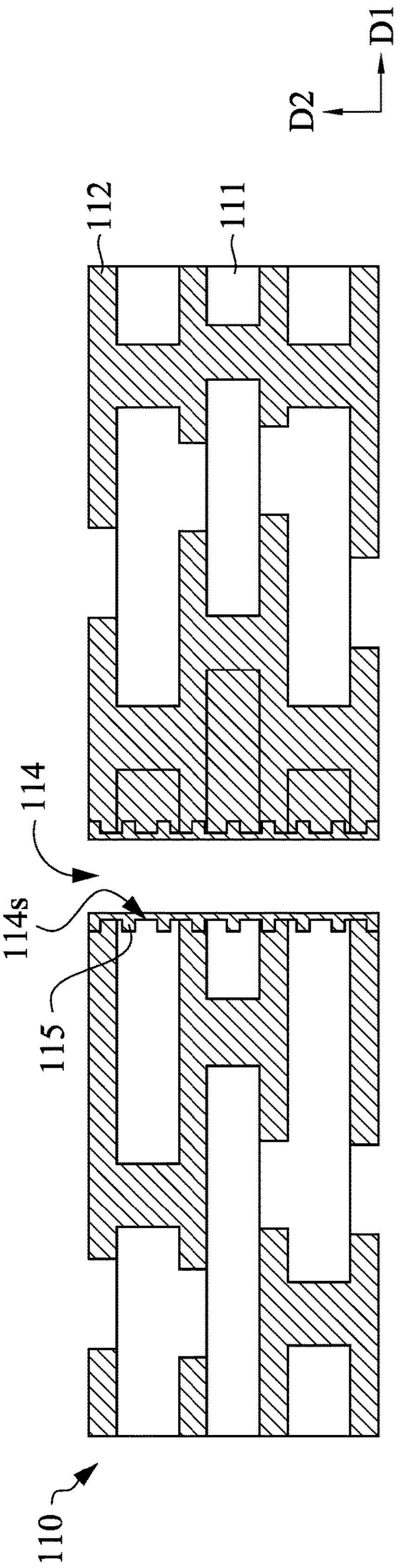

Reference is made to FIG. 4. A metal layer 115 is formed on the first inner wall 114*s* of the first threaded hole 114 by using a plating through-hole process. The metal layer 115 can be, for example, a metal copper layer.

Figure 5:
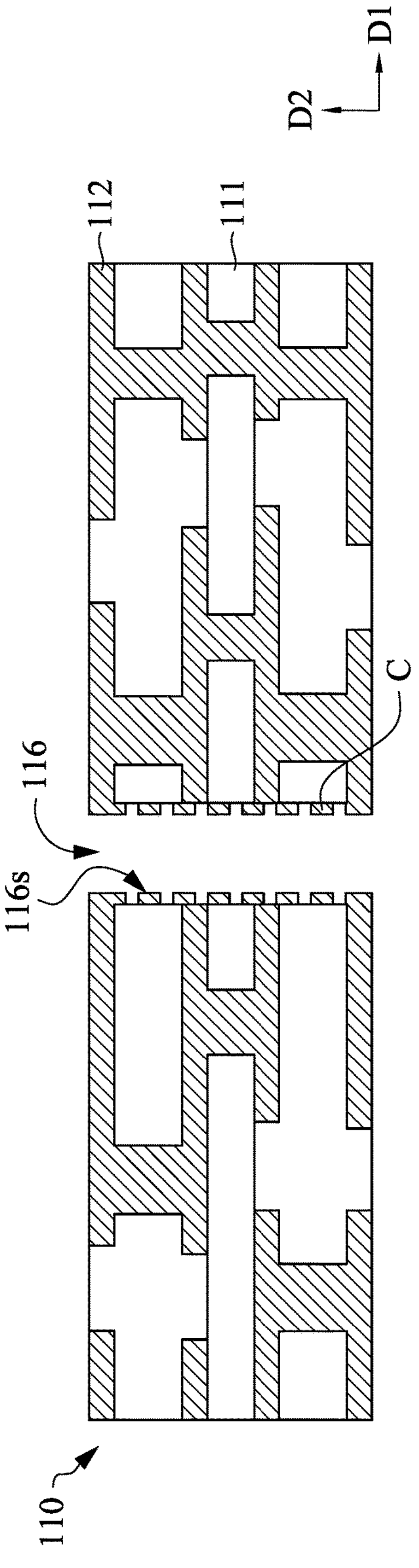

Reference is made to FIG. 5. A second threaded hole 116 is formed in the first threaded hole 114 (referring to FIG. 4) and the metal layer 115 (referring to FIG. 4) by using a second thread drill (not shown), in which a second inner wall 116*s* of the second threaded hole 116 has spiral coil circuits.

A continuous thread is firstly formed in the internal circuit structure 110 by using the first thread drill, and then the spiral coil circuits C are formed in the internal circuit structure 110 by using the second thread drill, so that the internal circuit structure 110 has spiral coil circuits C therein. In addition, an external thread of the second thread drill is opposite to an external thread of the first thread drill. For example, the first thread drill is a forward thread drill and has a clockwise external thread, while the second thread drill is a reverse thread drill and has a counterclockwise external thread.

Figure 6:
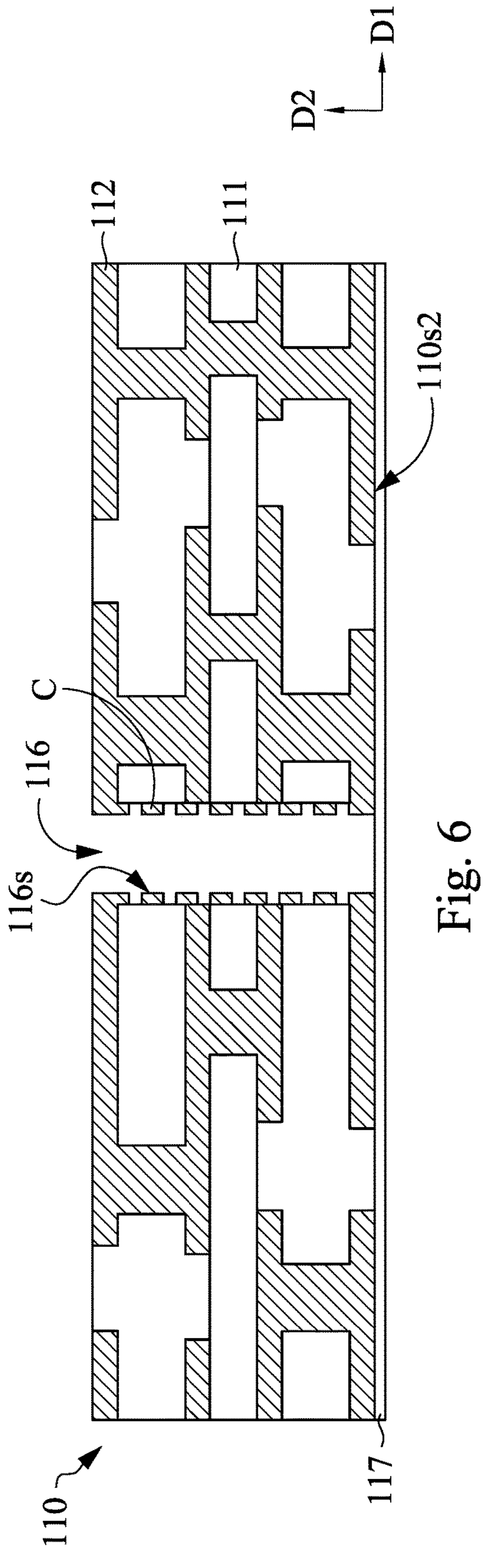

Reference is made to FIG. 6. An adhesive tape 117 is disposed on the second surface 110*s*2 of the internal circuit structure 110. In some embodiments, the adhesive tape 117 can be a polyimide (PI) adhesive tape.

Figure 7:
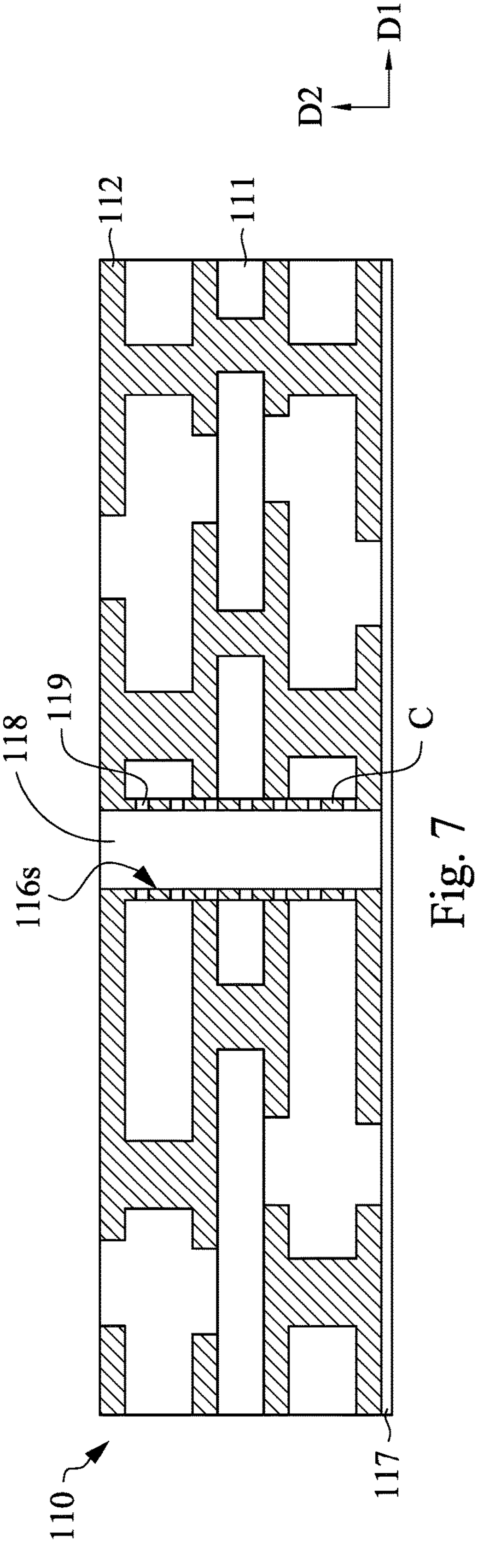

Reference is made to FIG. 7. A magnetic induction element 118 is disposed in the second threaded hole 116 (referring to FIG. 6). Specifically, after magnetic induction element 118 is disposed in the second threaded hole 116, a dielectric material 119 fills the gaps between the second threaded hole 116 and the magnetic induction element 118. In other words, the dielectric material 119 fills the gaps between the magnetic induction element 118 and the second inner wall 116*s*. In some embodiments, the dielectric material 119 is formed in the gaps by pressing.

The magnetic induction element 118 can be such as an unmagnetized ferromagnet or an unmagnetized ferrite magnet. The unmagnetized ferromagnet can include a ferromagnet that can be magnetized such as iron, cobalt, or nickel. The unmagnetized ferrite magnet can include a ferrite magnet that can be magnetized such as iron oxide and/or nickel oxide.

Figure 8:
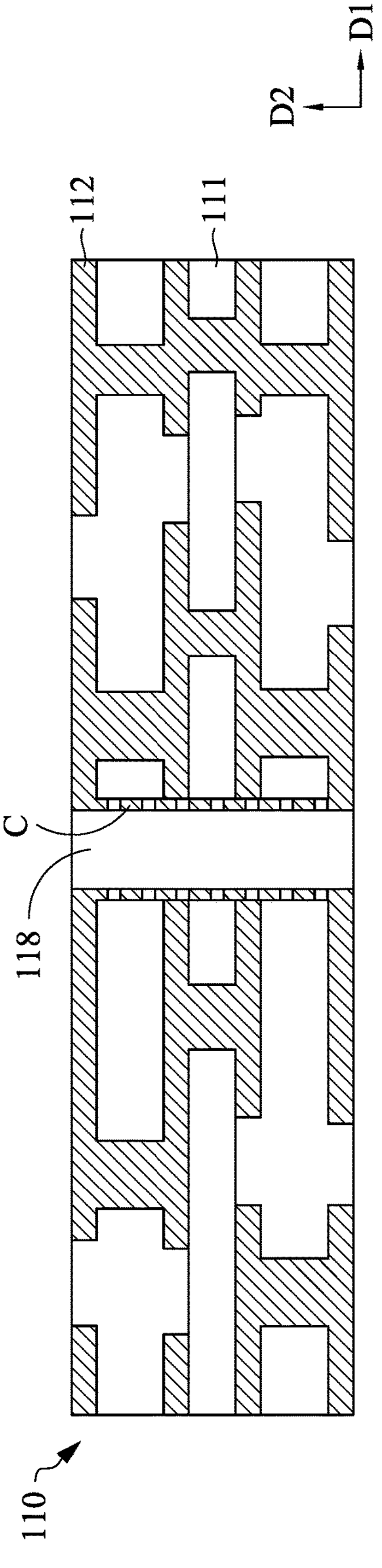

Reference is made to FIG. 8. After the magnetic induction element 118 is disposed in the second threaded hole 116, the adhesive tape 117 is removed.

Figure 9:
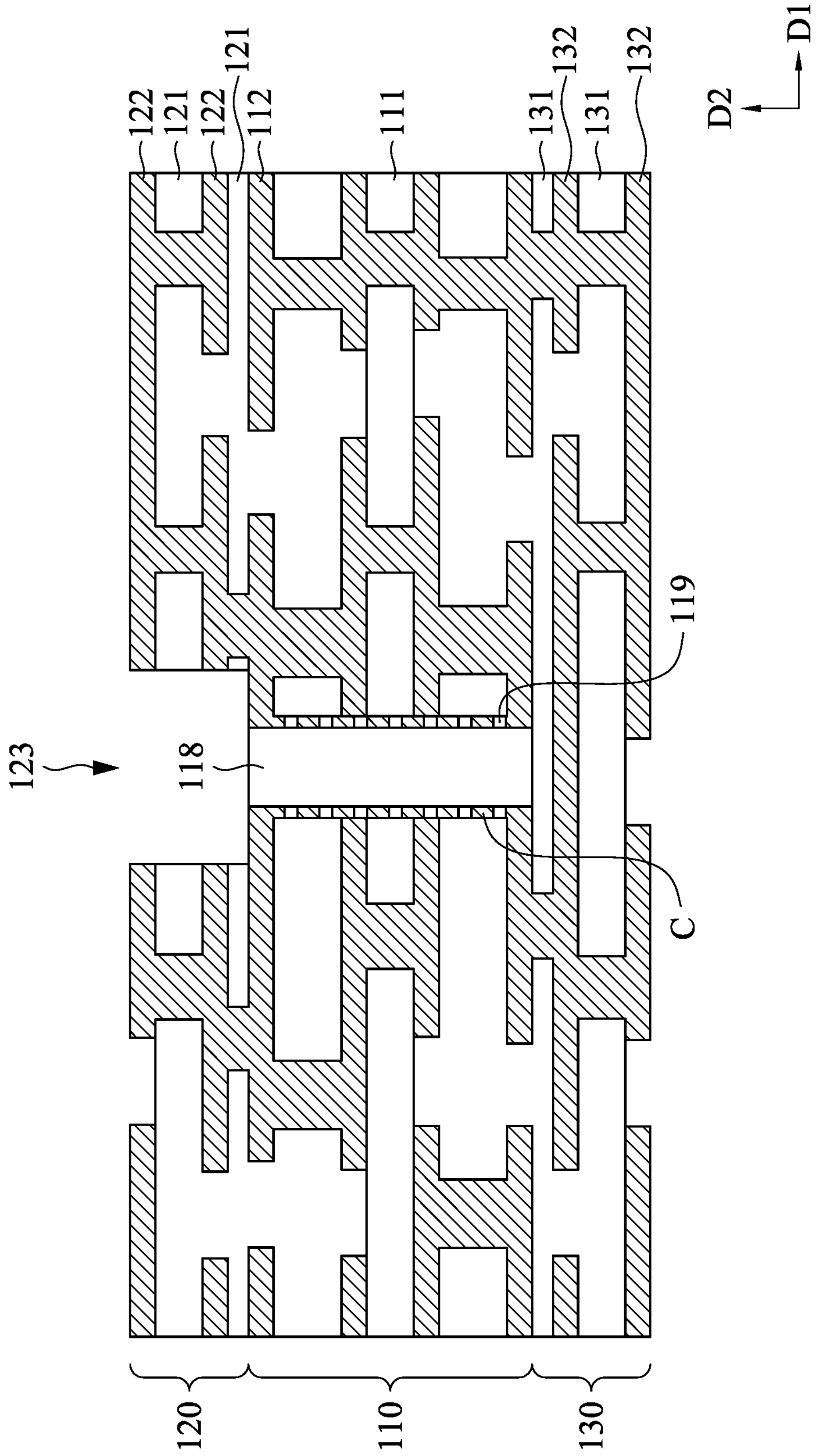

Reference is made to FIG. 9. A first external circuit structure 120 is formed on the first surface 110*s*1 (referring to FIG. 1) of the internal circuit structure 110, and a second external circuit structure 130 is formed on the second surface 110*s*2 (referring to FIG. 1) of the internal circuit structure 110. Similar to the internal circuit structure 110, the first external circuit structure 120 includes a plurality of insulating layers 121 and a plurality of circuit layers 122, in which the insulating layers 121 and the circuit layers 122 are arranged in a staggered manner. The second external circuit structure 130 includes a plurality of insulating layers 131 and a plurality of circuit layers 132, in which the insulating layers 131 and the circuit layers 132 are arranged in a staggered manner. Materials of the insulating layer 121 and the insulating layer 131 can be similar to the material of the insulating layer 111, rather than elaborating on it. The materials and the manufacturing methods of the circuit layers 122 and the circuit layers 132 can be similar to the material and the manufacturing method of circuit layer 112, rather than elaborating on it.

The plurality of insulating layers 121, the plurality of circuit layers 122, the plurality of insulating layer 131, and the plurality of the circuit layer 132 can be presses together to form a stacked structure. After the first external circuit structure 120 is formed, a routing method is used to form a recess 123, as shown in FIG. 9. The recess 123 exposes a top surface of the magnetic induction element 118.

Figure 10:
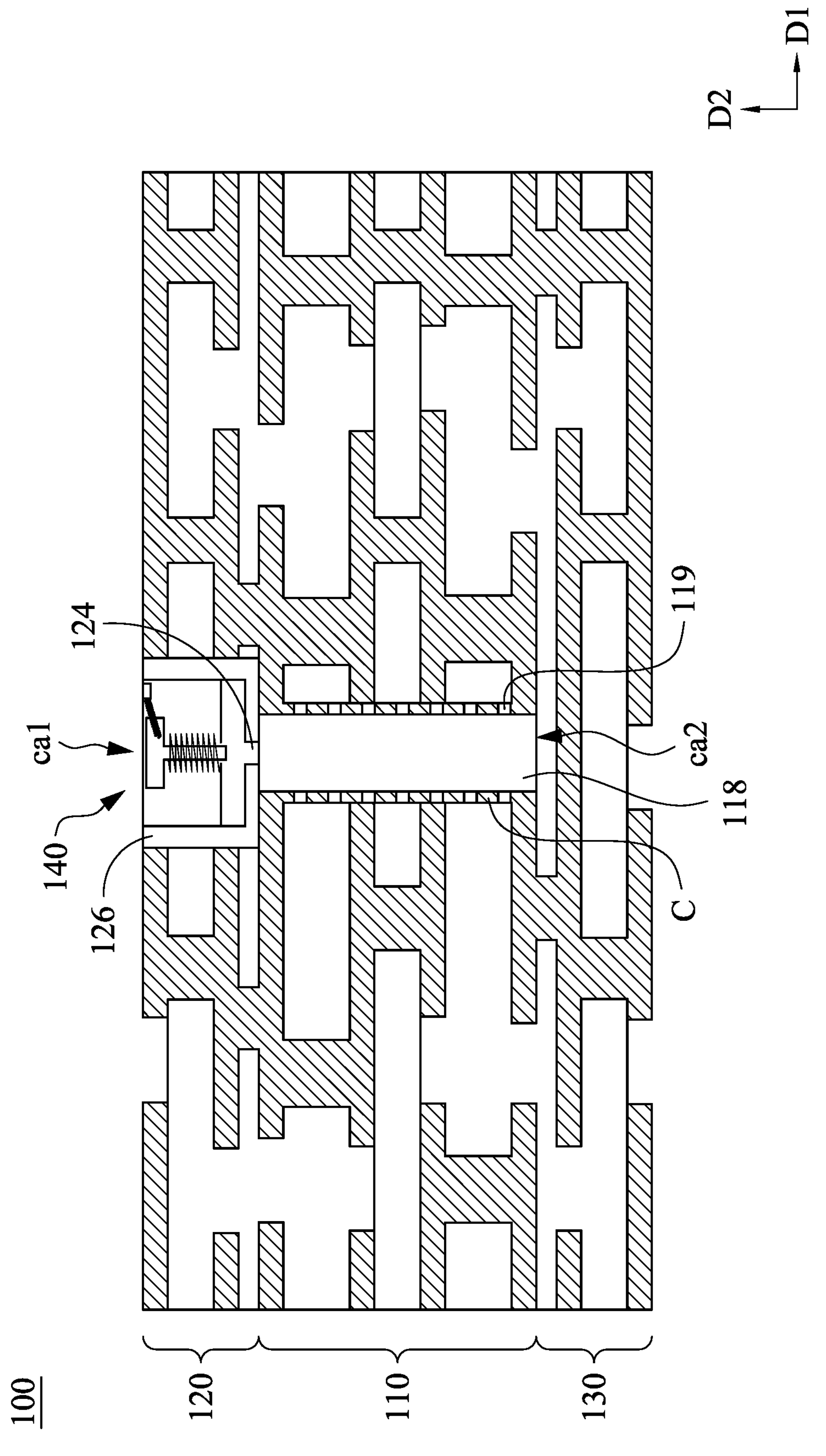

Reference is made to FIG. 10. A switch assembly 140 is formed in the recess 123 (referring to FIG. 9) of the first external circuit structure 120, in which a gap 124 exists between the switch assembly 140 and the magnetic induction element 118. The gap 124 can be such as an air gap. That is, the gap 124 can be filled with air. It could be understood that switch assembly 140 is a switch used to control electrical connection with an external circuit. The detailed structure of the switch assembly 140 will be described in FIG. 11A and FIG. 11B.

As shown in FIG. 10, a dielectric material 126 fills the gap between the first external circuit structure 120 and the switch assembly 140. In other words, the dielectric material 126 fills the gap between the switch assembly 140 and an inner wall of the recess 123 (referring to FIG. 9). In some embodiments, the material of the dielectric material 126 is the same as the material of the dielectric material 119.

Reference is made to FIG. 10 again. The relay circuit board 100 includes the first external circuit structure 120, the second external circuit structure 130, the internal circuit structure 110, the magnetic induction element 118, and the switch assembly 140. The first external circuit structure 120 has a first cavity ca1. The internal circuit structure 110 has a second cavity ca2, in which the second cavity ca2 extends from the first external circuit structure 120 to the second external circuit structure 130, and the first cavity ca1 communicates with the second cavity ca2. The magnetic induction element 118 is disposed in the second cavity ca2. The switch assembly 140 is disposed in the first cavity ca1. At least one surface of the switch assembly 140 is exposed to an exterior of the relay circuit board 100, and the gap 124 exists between the switch assembly 140 and the magnetic induction element 118.

The internal circuit structure 110 includes the plurality of coil circuits C. The plurality of coil circuits C surrounds the magnetic induction element 118 and is embedded in the inner wall of the second cavity ca2, in which these coil circuits C and magnetic induction element 118 can form an electromagnet. Therefore, the magnetic induction element 118 generates a magnetic field when the coil circuits are energized. In addition, the coil circuits C, the magnetic induction element 118, and the switch assembly 140 can essentially form a relay.

Figure 11B:
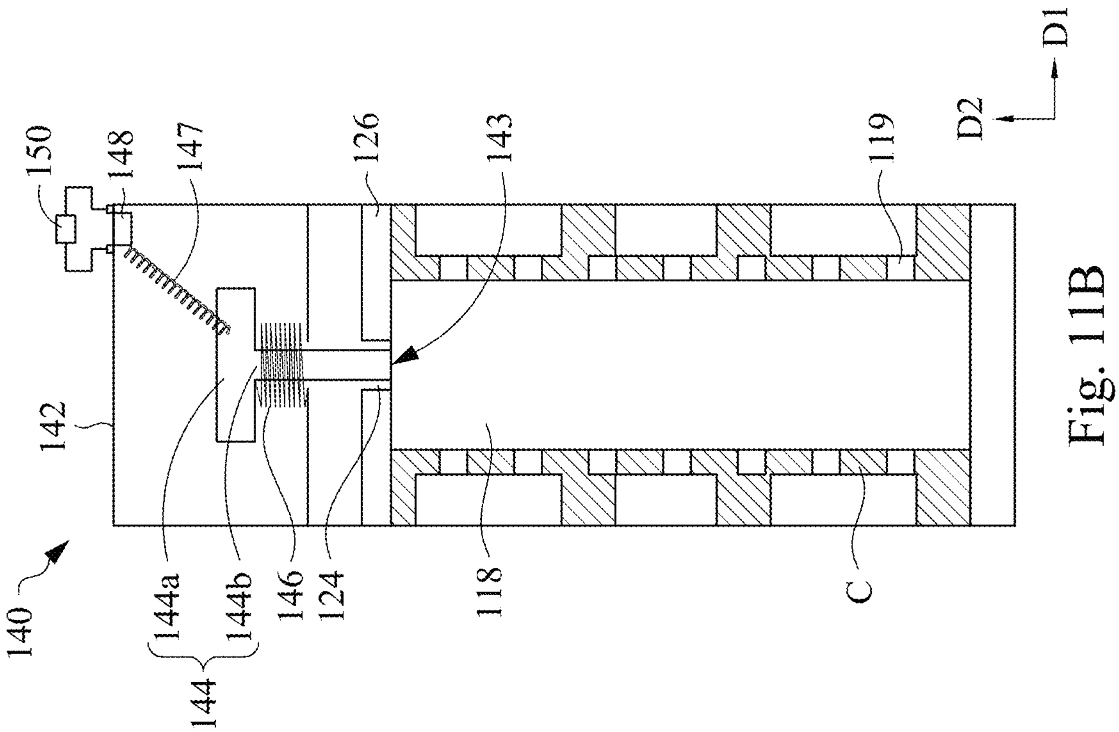
FIG. 11B is a partial cross-sectional view a plurality of coil circuits when the coil circuits are energized in according to at least one embodiment of the present invention.
Figure 11A:
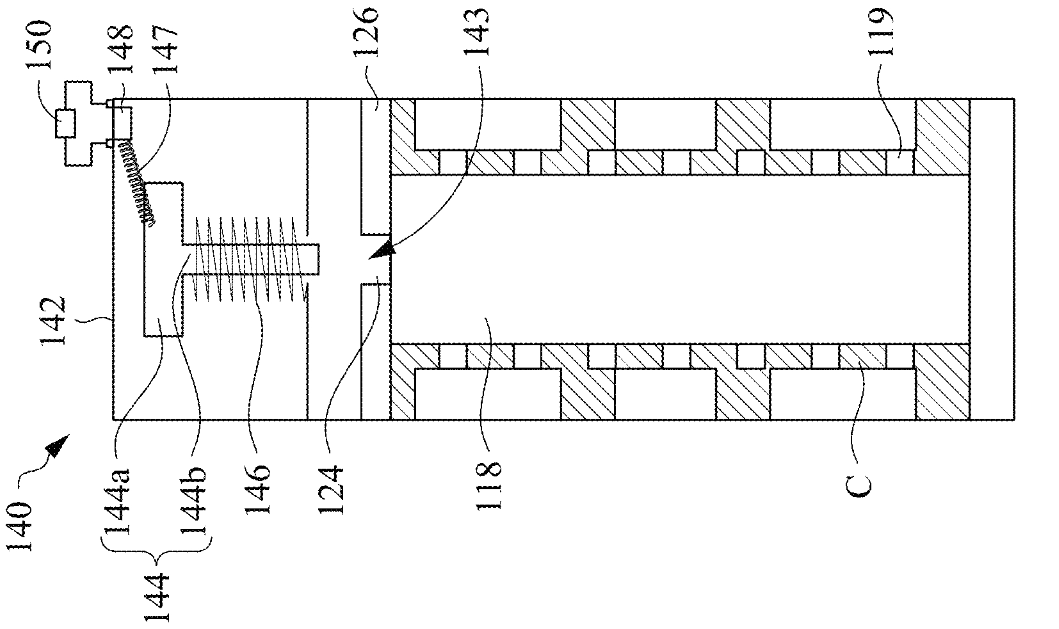
FIG. 11A is a partial cross-sectional view of a plurality of coil circuits when the coil circuits are de-energized in according to at least one embodiment of the present invention.

FIG. 11A is a partial cross-sectional view of the plurality of coil circuits C when the coil circuits C are de-energized in according to at least one embodiment of the present invention. FIG. 11B is a partial cross-sectional view the plurality of coil circuits C when the coil circuits C are energized in according to at least one embodiment of the present invention. Reference is made to FIG. 11A, the switch assembly 140 includes a housing 142. The housing 142 includes an opening 143, in which the gap 124 is below the opening 143. In other words, the gap 124 is located between the housing 142 and the magnetic induction element 118.

The switch assembly 140 further includes a moving part 144 and a first spring 146. The moving part 144 includes a main portion 144*a* and an extension portion 144*b* connected to the main portion 144*a*. The first spring 146 surrounds the extension portion 144*b* of the moving part 144. The opening 143 of the housing 142 is configured to allow the extension portion 144*b* of the moving part 144 to shuttle between an interior of the housing 142 and the gap 124.

The moving part 144 is an unmagnetized ferromagnet or an unmagnetized ferrite magnet. The unmagnetized ferromagnet can include a ferromagnet that can be magnetized such as iron, cobalt, or nickel. The unmagnetized ferrite magnet can include a ferrite magnet that can be magnetized such as iron oxide and/or nickel oxide.

Still referring to FIG. 11A, the switch assembly 140 further includes a second spring 147 and a conductive block 148. The second spring 147 is used to connect the moving part 144 and the conductive block 148. The conductive block 148 can be, for example, a metal conductive block. The conductive block 148 is used to electrically connect to a load 150 (for example, an external circuit, an electronic component, or a power supply). The load 150 shown in FIG. 11B is represented by a block, and is not a true depiction of the load 150.

Reference is made to FIG. 11B. When the coil circuits C are energized, the magnetic induction element 118 generates a magnetic field, which attracts the moving part 144, causing the moving part 144 to connect to the magnetic induction element 118. Specifically, when the magnetic induction element 118 generates the magnetic field, both the magnetic induction element 118 and the moving part 144 are temporarily magnetized, so that the extension portion 144*b* of the moving part 144 passes through the opening 143 and the gap 124 to contact the top surface of the magnetic induction element 118. Because the moving part 144 is pulled down by the first spring 146 along the second direction D2, the second spring 147 extends. The conductive block 148 remains electrically connected to the load 150 and therefore the load 150 is electrically connected to the magnetic induction element 118.

Referring to FIG. 11A again, when the plurality of coil circuits C is de-energized, the first spring 146 biases the moving part 144 away from the magnetic induction element

118. At this moment, the conductive block 148 connects and is electrically connected to the load 150, but the load 150 is not electrically connected to the magnetic induction element 118.

It could be understood that FIG. 10 mere shows a set of embedded relay (i.e., a set of coil circuits C, one magnetic induction element 118, and one switch assembly 140). However, in other embodiments, the relay circuit board of the present invention can also include multiple sets of embedded relays, and is not limited to one set of embedded relay.

In view of the above, the relay circuit board of the present invention has the magnetic induction element and the switch assembly, and the magnetic induction element and the switch assembly are embedded in the circuit board. The embedded structure can reduce an overall size of the relay circuit board, thereby achieving an automatic control circuit. In addition, the embedded coil circuits of the present invention are formed in the circuit board using thread drills, thus simplifying the manufacturing process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A relay circuit board, comprising:

a first external circuit structure having a first cavity;

a second external circuit structure; and an internal circuit structure disposed between the first external circuit structure and the second external circuit structure and having a second cavity, wherein the second cavity extends from the first external circuit structure to the second external circuit structure, and the first cavity communicates with the second cavity;

a magnetic induction element disposed in the second cavity; and a switch assembly disposed in the first cavity, wherein at least one surface of the switch assembly is exposed to an exterior of the relay circuit board, and a gap exists between the switch assembly and the magnetic induction element, wherein the internal circuit structure comprises a plurality of coil circuits, and the plurality of coil surrounds the magnetic induction element and is embedded in an inner wall of the second cavity, wherein when the coil circuits are energized, the magnetic induction element generates a magnetic field.

2. The relay circuit board of claim 1, wherein the switch assembly comprises:

a moving part comprising a main portion and an extension portion connected to the main portion, wherein the magnetic induction element uses the magnetic field to attract the moving part such that the moving part is connected to the magnetic induction element; and a first spring surrounding the extension portion of the moving part.

3. The relay circuit board of claim 2, wherein the switch assembly further comprises:

a second spring and a conductive block, wherein the second spring is connected to the moving part and the conductive block, and the conductive block is used to electrically connect to a load.

4. The relay circuit board of claim 2, wherein both the magnetic induction element and the moving part are unmagnetized ferromagnets or unmagnetized ferrite magnets.

5. The relay circuit board of claim 4, wherein when the plurality of coil circuits is de-energized, the first spring biases the moving part away from the magnetic induction element.

6. The relay circuit board of claim 2, wherein the switch assembly further comprising:

a housing, wherein the gap is located between the housing and the magnetic induction element, the housing comprises an opening, and the opening is configured to allow the extension portion of the moving part to shuttle between an interior of the housing and the gap.

7. The relay circuit board of claim 1, wherein the internal circuit structure comprises a plurality of insulating layers and a plurality of circuit layers, and the insulating layers and the circuit layers are arranged in a staggered manner.

* * * * *